(12) United States Patent
Chung et al.

(10) Patent No.: US 11,657,890 B2
(45) Date of Patent: May 23, 2023

(54) MEMORY SYSTEM, INTEGRATED CIRCUIT SYSTEM, AND OPERATION METHOD OF MEMORY SYSTEM

(71) Applicant: SK hynix Inc., Gyeonggi-do (KR)

(72) Inventors: Hoiju Chung, San Jose, CA (US); Paul Fahey, Campbell, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/679,804

(22) Filed: Feb. 24, 2022

(65) Prior Publication Data

US 2022/0180960 A1 Jun. 9, 2022

Related U.S. Application Data

(62) Division of application No. 16/939,741, filed on Jul. 27, 2020, now Pat. No. 11,322,219.

(60) Provisional application No. 62/944,586, filed on Dec. 6, 2019.

(51) Int. Cl.
| | |
|---|---|
| *G11C 29/36* | (2006.01) |
| *G11C 29/42* | (2006.01) |
| *G11C 29/44* | (2006.01) |
| *G11C 29/52* | (2006.01) |

(52) U.S. Cl.
CPC ............ *G11C 29/42* (2013.01); *G11C 29/36* (2013.01); *G11C 29/44* (2013.01); *G11C 29/52* (2013.01); *G11C 2029/4402* (2013.01)

(58) Field of Classification Search
CPC ......... G11C 29/42; G11C 29/36; G11C 29/44; G11C 29/52; G11C 2029/4402

USPC ......................................................... 365/201
See application file for complete search history.

(56) References Cited

U.S. PATENT DOCUMENTS

| | | | |
|---|---|---|---|
| 10,102,064 B1* | 10/2018 | Baty .................... | G06F 11/1012 |
| 11,030,040 B2* | 6/2021 | Chung .................. | G06F 3/0619 |
| 2013/0166986 A1* | 6/2013 | Alrod .................. | G06F 11/1048 |
| | | | 714/755 |
| 2014/0075262 A1* | 3/2014 | Kitasho ................. | H03M 13/05 |
| | | | 714/755 |
| 2016/0062829 A1* | 3/2016 | Harasawa ......... | H03M 13/2903 |
| | | | 714/755 |
| 2016/0124784 A1* | 5/2016 | Chung ................ | G06F 11/1008 |
| | | | 714/704 |
| 2018/0013451 A1* | 1/2018 | Kaynak .................. | G11C 29/52 |
| 2018/0165151 A1* | 6/2018 | Lee ...................... | G06F 11/1048 |
| 2019/0012230 A1* | 1/2019 | Chung .................. | G06F 3/0673 |
| 2019/0138392 A1* | 5/2019 | Jung .................... | G11C 11/5642 |

(Continued)

*Primary Examiner* — Ly D Pham
(74) *Attorney, Agent, or Firm* — IP & T Group LLP

(57) ABSTRACT

A memory system may include a memory controller suitable for transmitting write data and a first write ECC corresponding to the write data during a write operation, a first error correction circuit suitable for detecting whether the write data received from the memory controller has an error, using the first write ECC received from the memory controller, and correcting the error when the error is detected, a second ECC generation circuit suitable for generating a second write ECC using the write data received from the memory controller, and generating the second write ECC using the write data whose error has been corrected by the first error correction circuit, when the detection of the error is noticed from the first error correction circuit, and one or more memories suitable for storing the second write ECC and write data corresponding to the second write ECC.

8 Claims, 4 Drawing Sheets

(56) References Cited

U.S. PATENT DOCUMENTS

2020/0142772 A1* 5/2020 Chung ................ G06F 11/1068
2021/0083690 A1* 3/2021 Jang ..................... G06F 3/0653

* cited by examiner

MEMORY SYSTEM, INTEGRATED CIRCUIT SYSTEM, AND OPERATION METHOD OF MEMORY SYSTEM

CROSS-REFERENCE TO RELATED APPLICATION(S)

This application is a division of U.S. patent application Ser. No. 16/939,741 filed on Jul. 27, 2020, which claims benefits of U.S. Provisional Application No. 62/944,586, filed on Dec. 6, 2019. The disclosure of each of the foregoing application is incorporated herein by reference in its entirety.

BACKGROUND

1. Field

Exemplary embodiments relate to a memory system and an integrated circuit system.

2. Discussion of the Related Art

At the initial stage of the semiconductor memory industry, many of memory chips had original good dies each having no defective cells distributed on a wafer. However, the increase in capacity of memory devices has made it difficult to fabricate a memory device having no defective cells. Currently, there is almost no probability that such a memory device will be fabricated. As a measure for overcoming such a situation, a method for repairing defective memory cells of a memory device with redundancy memory cells is used.

As another measure, an error correction circuit for correcting an error in a memory system is used to correct an error which occurs in a memory cell and an error which occurs while data are transmitted during a read/write process of the memory system.

SUMMARY

Various embodiments are directed to a technology capable of reducing latency required for error correction while raising the efficiency of the error correction.

In an embodiment, a memory system may include: a memory controller suitable for transmitting write data and a first Error Correction Code (ECC) corresponding to the write data during a write operation; a first error correction circuit suitable for correcting an error within the transmitted write data when the error is detected within the transmitted write data, through the transmitted first ECC; a second ECC generation circuit suitable for generating a second ECC based on the transmitted write data when an error is not detected within the transmitted write data or the error-corrected write data when the error is corrected within the transmitted write data; and one or more memories suitable for storing the generated second ECC and the transmitted write data or the error-corrected write data.

In an embodiment, an integrated circuit system may include a first device, a second device and a third device, wherein the first device is suitable for transmitting upstream data and a first Error Correction Code (ECC) corresponding to the upstream data during an upstream operation, wherein the second device comprises: a first error correction circuit suitable for correcting an error within the transmitted upstream data when the error is detected within the transmitted upstream data, through the transmitted first ECC; and a second ECC generation circuit suitable for generating a second ECC based on the transmitted upstream data when an error is not detected within the transmitted upstream data or the error-corrected upstream data when the error is corrected within the transmitted upstream data, wherein the third device receives the generated second ECC and the transmitted upstream data or the error-corrected upstream data.

In an embodiment, an operation method of a memory system may include: transmitting, by a memory controller, write data and a first Error Correction Code (ECC) corresponding to the write data to a module controller; performing, by the module controller, a first operation of generating a second ECC based on the transmitted write data; finding and correcting, by the module controller, an error within the transmitted write data through the first ECC; canceling the first operation in response to the found error; performing, by the module controller, a second operation of generating the second ECC based on the error-corrected write data; and transmitting, by the module controller, the generated second ECC and the error-corrected write data to one or more memories.

In an embodiment, a memory system may include: a memory controller suitable for transmitting write data and a first write ECC corresponding to the write data during a write operation; a first error correction circuit suitable for detecting whether the write data received from the memory controller has an error, using the first write ECC received from the memory controller, and correcting the error when the error is detected; a second ECC generation circuit suitable for generating a second write ECC using the write data outputted from the first error correction circuit; and one or more memories suitable for storing the second write ECC and write data corresponding to the second write ECC, wherein the second write ECC has an error correction ability superior to that of the first write ECC.

In an embodiment, operation method of a controller may include: error-decoding write data through a first error correction code, the write data being provided with the first error correction code; error-encoding, when the provided write data is not error-corrected during the error-decoding of the provided write data, the provided write data to generate a second error correction code; error-encoding, when the provided write data is error-corrected during the error-decoding of the provided write data, the error-corrected write data to generate a third error correction code; and controlling a memory device to store therein a pair of the provided write data and the second error correction code or a pair of the error-corrected write data and the third error correction code.

In accordance with the present embodiments, it is possible to reduce latency required for error correction while raising the efficiency of the error correction.

DETAILED DESCRIPTION

Figure 1:
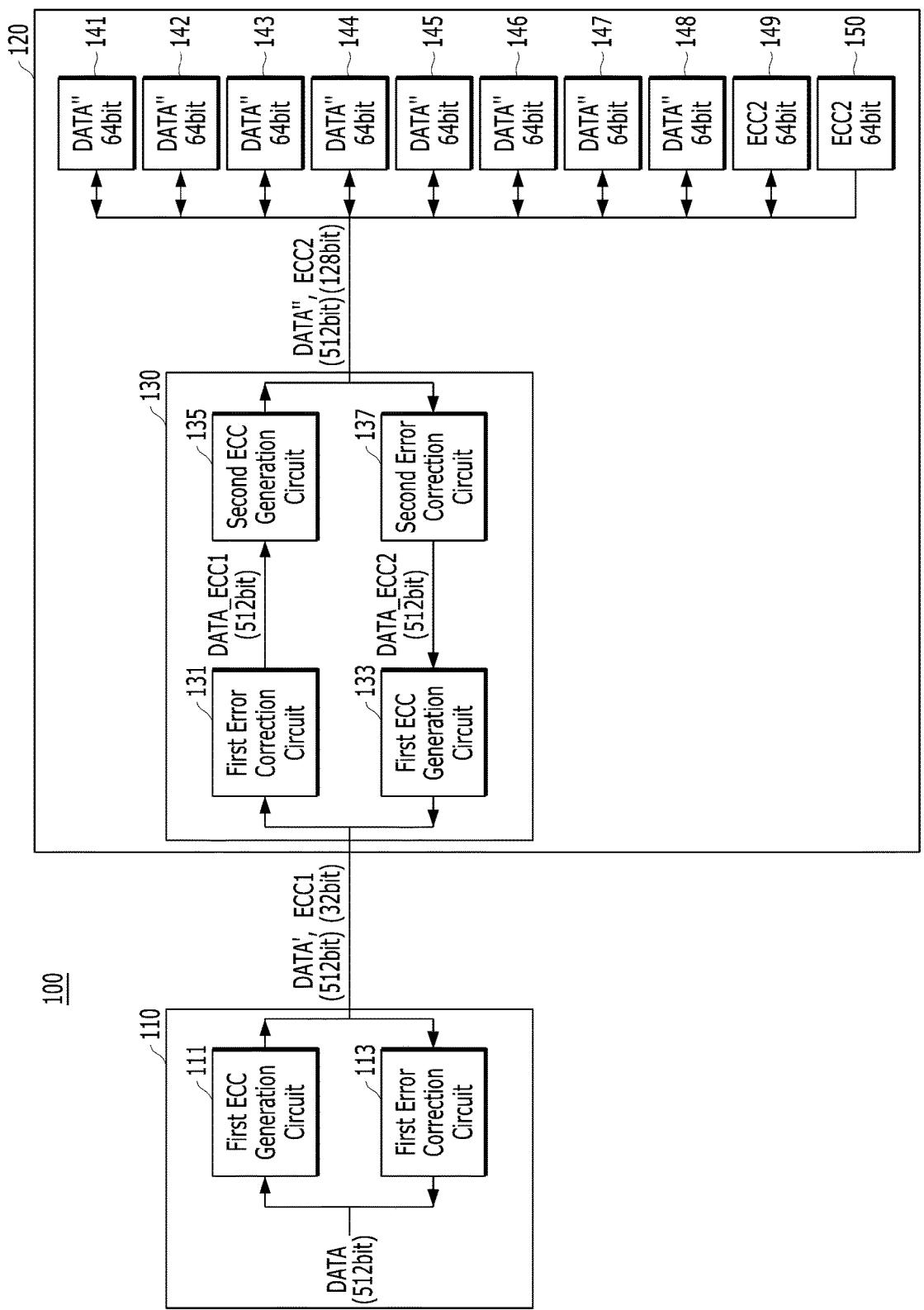
FIG. 1 is a configuration diagram illustrating a memory system 100 in accordance with an embodiment of the present disclosure.

Hereafter, exemplary embodiments will be described with reference to the accompanying drawings, in order to describe the present disclosure in detail such that a person skilled in the art to which the present disclosure pertains can easily carry out the technical spirit of the present disclosure. In the descriptions of the present embodiment, components which are irrelevant to the subject matter of the present embodiment may be omitted. When reference numbers are given to components of the drawings, the same components will be represented by like reference numerals even though the components are illustrated in different drawings.

FIG. 1 is a configuration diagram illustrating a memory system 100 in accordance with an embodiment of the present disclosure. FIG. 1 illustrates only parts which are directly related to data transmission and error correction in the memory system 100.

Referring to FIG. 1, the memory system 100 may include a memory controller 110 and a memory module 120. The memory controller 110 may control read and write operations of the memory module 120 according to a request of a host.

The memory controller 110 may include a first ECC (Error Correction Code) generation circuit 111 and a first error correction circuit 113.

The first ECC generation circuit 11 may generate a first ECC ECC1 based on data DATA transferred from the host, i.e. write data to be written to the memory module 120, during a write operation. The first ECC ECC1 may have a smaller number of bits and a lower error correction ability than a second ECC ECC2 which will be described below. Here, it is exemplified that the data DATA has 512 bits, and the first ECC ECC1 has 32 bits. During the write operation, the first ECC generation circuit 111 only generates the first ECC ECC1 based on the data DATA, and does not correct an error. Therefore, the data DATA may be equal to data DATA'. The reason why it is exemplified that the data DATA has 512 bits is because 512-bit data is transferred during one write/read operation. This configuration may be different for each memory system. For example, there may be a memory system which writes or reads 256-bit data during one write/read operation and a memory system which writes or reads 128-bit data during one write/read operation.

During a read operation, the first error correction circuit 113 may detect an error within data DATA' transferred from the memory module 120, using the first ECC ECC1 from the memory module 120, and correct the detected error when the error is present. The data DATA' and the data DATA may be equal to each other when the data DATA' has no error, and different from each other when the data DATA' has an error. The data DATA may be transferred to the host. The term 'first' in the first ECC generation circuit 111 and the first error correction circuit 113 may indicate that the circuits use a first error correction method.

The memory module 120 may include a module controller 130 and memories 141 to 150. The memory module 120 may be configured in a DIMM (Dual In-Line Memory Module) type or a different type.

Write data transferred from the memory controller 110 during a write operation may be transferred to the memories 141 to 150 through the module controller 130, and read data transferred from the memories 141 to 150 during a read operation may be transferred to the memory controller 110 through the module controller 130. During this process, the module controller 130 may perform an operation of correcting an error. The module controller 130 may include a first error correction circuit 131, a first ECC generation circuit 133, a second ECC generation circuit 135 and a second error correction circuit 137.

During a write operation, the first error correction circuit 131 may detect an error within the data DATA' using the first ECC ECC1 from the memory controller 110, and correct the detected error when the error is present. The first error correction circuit 131 may use the first error correction method as indicated by the term 'first'. The data DATA' and data DATA_ECC1 may be equal to each other when the data DATA' has no error, and different from each other when the data DATA' has an error.

The second ECC generation circuit 135 may generate a second ECC ECC2 based on the data DATA_ECC1 on which the error correction operation has been performed by the first error correction circuit 131, during the write operation. The second ECC ECC2 may have a larger number of bits and a higher error correction ability than the first ECC ECC1. Here, it is exemplified that the second ECC2 has 128 bits. The second ECC generation circuit 135 uses a second error correction method as indicated by the term 'second'. The second error correction method may have a greater error correction ability than the first error correction method. For example, when the first error correction method is a hamming method, the second error correction method may be an RS (Reed Solomon) method. This is only an example for the first and second error correction methods, and the first and second error correction methods may be simply different error correction methods. Desirably, the second error correction method may use an ECC with a larger number of bits than the first error correction method and have a greater error correction ability than the second error correction method. The second ECC generation circuit 135 only generates the second ECC ECC2 based on the data DATA_ECC1, and does not correct an error within the data DATA_ECC1. Therefore, the data DATA_ECC1 may be equal to data DATA".

The second error correction circuit 137 may detect an error within the data DATA" using the second ECC ECC2 read from the memories 141 to 150, and correct the detected error when the error is present. The second error correction circuit 137 may use the second error correction method as indicated by the term 'second'. The data DATA" and data DATA_ECC2 may be equal to each other when the data DATA" has no error, and different from each other when the data DATA" has an error.

The first ECC generation circuit 133 may generate the first ECC ECC1 based on the data DATA_ECC2. The first ECC generation circuit 133 only generates the first ECC ECC1 based on the data DATA_ECC2, and does not correct an error within the data DATA_ECC2. Therefore, the data DATA_ECC2 and the data DATA' may be equal to each other. The first ECC generation circuit 133 may use the first error correction method as indicated by the term 'first'.

Between the memory controller 110 and the module controller 130, the first error correction method is used. However, the second error correction method is used from the rear stage of the module controller 130. That is, the module controller 130 terminates the first error correction method, and uses the second error correction method different from the first error correction method. This is in order to perform a stronger error correction operation in the memory module 120.

Each of the memories 141 to 150 may store 64-bit data during one write operation, and output 64-bit data during one read operation. FIG. 1 illustrates a distribution pattern of the data DATA" and the second ECC ECC2 in the memories 141 to 150. The 512-bit data DATA" may be written to/read from the eight memories 141 to 148 among the 10 memories 141 to 150, and the 128-bit second ECC ECC2 may be written to/read from the two memories 149 and 150. The distribution pattern of the data DATA" and the second ECC ECC2 does not need to be configured in the same manner as described with reference to FIG. 1. The distribution pattern is not particularly limited as long as the data DATA" and the second ECC ECC2 are distributed and stored in the memories 141 to 150. Furthermore, the number of the memories 141 to 150 is not limited to 10, but may be set to a random number equal to or more than one. The memories 141 to 150 may be one of all types of memories such as a DRAM, PCRAM (Phase Change Random Access Memory) and Flash memory.

During a write operation, the data DATA is transferred to the memories 141 to 150 through the first ECC generation circuit 111, the first error correction circuit 131 and the second ECC generation circuit 135. During a read operation, the data DATA" outputted from the memories 141 to 150 may be transferred to the host through the second error correction circuit 137, the first ECC generation circuit 133 and the first error correction circuit 113. During the write operation, considerable latency occurs because the operations of the circuits 111, 131 and 135 are serially performed. Even during the read operation, considerable latency inevitably occurs because the operations of the circuits 137, 133 and 113 are serially performed.

Figure 2:
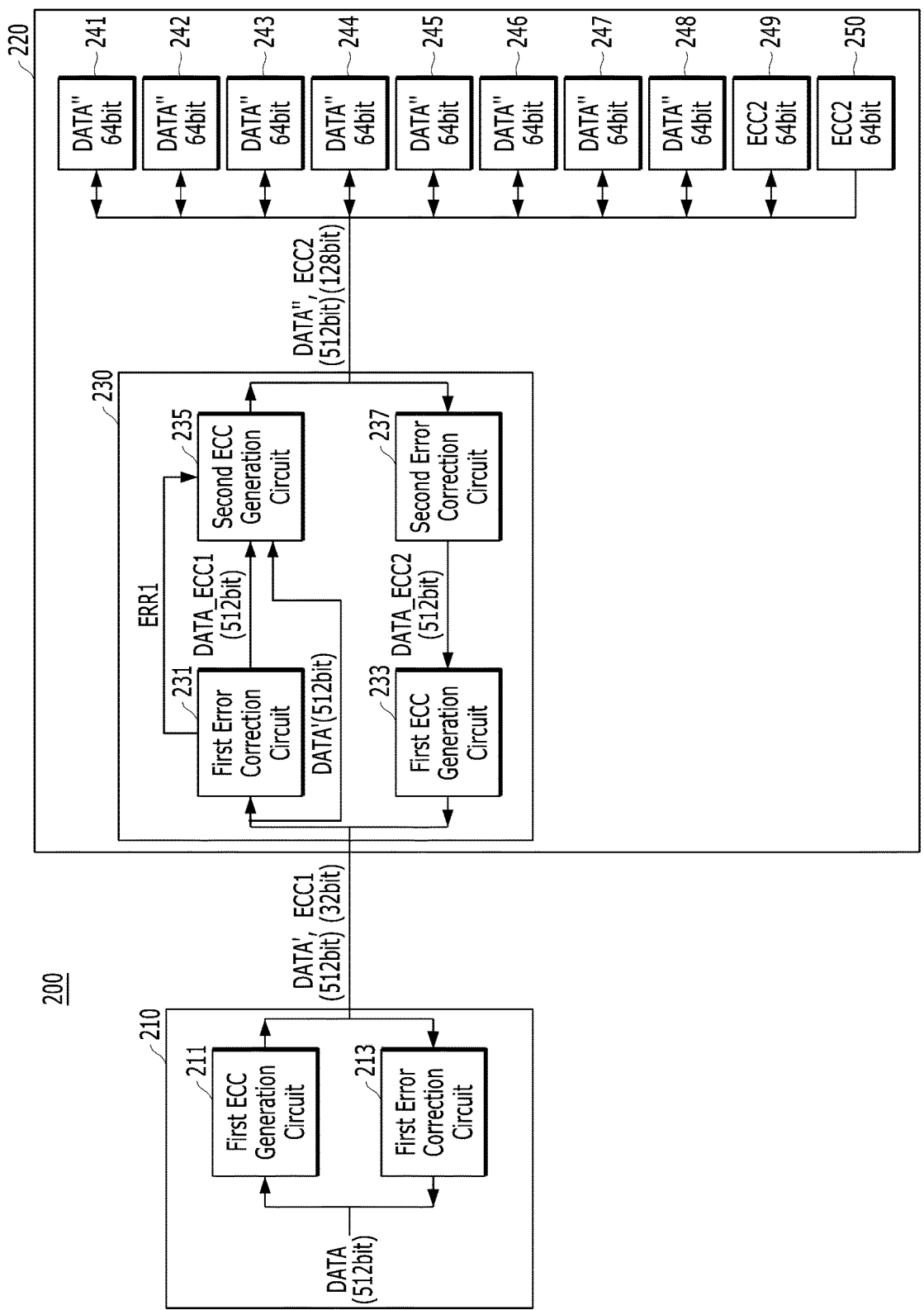
FIG. 2 is a configuration diagram illustrating a memory system 200 in accordance with an embodiment of the present disclosure.

FIG. 2 is a configuration diagram illustrating a memory system 200 in accordance with an embodiment of the present disclosure. FIG. 2 illustrates only parts which are directly related to data transmission and error correction in the memory system 200.

Referring to FIG. 2, the memory system 200 may include a memory controller 110 and a memory module 220. The memory controller 210 may control read and write operations of the memory module 220 according to a request of a host.

The memory controller 210 may include a first ECC generation circuit 211 and a first error correction circuit 213.

The first ECC generation circuit 211 may generate a first ECC ECC1 based on data DATA transferred from the host, i.e. write data to be written to the memory module 220, during a write operation. During the write operation, the first ECC generation circuit 211 only generates the first ECC ECC1 based on the data DATA, and does not correct an error. Therefore, the data DATA may be equal to data DATA'.

During a read operation, the first error correction circuit 213 may detect an error within data DATA' transferred from the memory module 220 using the first ECC ECC1 from the memory module 220, and correct the detected error when the error is present. The data DATA' and the data DATA may be equal to each other when the data DATA' has no error, and different from each other when the data DATA' has an error. The data DATA may be transferred to the host. The first ECC generation circuit 211 and the first error correction circuit 213 may use a first error correction method.

The memory module 220 may include a module controller 230 and memories 241 to 250. The memory module 220 may be configured as a DIMM type or a different type.

Write data transferred from the memory controller 210 during a write operation may be transferred to the memories 241 to 250 through the module controller 230, and read data transferred from the memories 241 to 250 during a read operation may be transferred to the memory controller 210 through the module controller 230. During this process, the module controller 230 may perform an operation of correcting an error. The module controller 230 may include a first error correction circuit 231, a first ECC generation circuit 233, a second ECC generation circuit 235 and a second error correction circuit 237.

During a write operation, the first error correction circuit 231 may detect an error within the data DATA' using the first ECC ECC1 transferred from the memory controller 210, and correct the detected error when the error is present. The first error correction circuit 231 may use the first error correction method. The data DATA' and data DATA_ECC1 may be equal to each other when the data DATA' has no error, and different from each other when the data DATA' has an error. An error signal ERR1 outputted from the first error correction circuit 231 may be enabled when an error within the data DATA' is detected.

During a write operation, the second ECC generation circuit 235 may perform a first operation of generating a second ECC ECC2 based on the data DATA' transferred from the memory controller 210. The first operation of the second ECC generation circuit 235 may be performed in parallel to the error correction operation of the first error correction circuit 231. Since the second ECC generation circuit 235 uses a second error correction method which is more complicated than the first error correction method used by the first error correction circuit 231, the time required for the first operation may be longer than the time required for the error correction operation of the first error correction circuit 231. When the first error correction circuit 231 detects an error, the error signal ERR1 may be enabled, and the second ECC generation circuit 235 may cancel the first operation in response to the enabled error signal ERR1. Then, the second ECC generation circuit 235 may perform a second operation of generating the second ECC ECC2 based on the data DATA_ECC1 whose error has been corrected by the first error correction circuit 231, not the data DATA'. That is, the second ECC generation circuit 235 may basically generate the second ECC ECC2 based on the data DATA'. However, only when an error is found in the data DATA', the second ECC generation circuit 235 may generate the second ECC ECC2 based on the data DATA_ECC1 whose error has been corrected. In most cases in which the data DATA' has no error, the first operation of the second ECC generation circuit 235 is performed in parallel to the error correction operation of the first error correction circuit 231. Therefore, the second ECC ECC2 may be quickly generated.

Since the second ECC generation circuit 235 quickly generates the second ECC ECC2 when the data DATA' has no error, the latency required for the write operation of the memory system 200 may be reduced more than in the memory system 100. Although the data DATA' has an error, the latency required for the write operation of the memory system 200 may be only equal to that of the memory system 100, and not be increased.

The second error correction circuit 237 may detect an error within data DATA" using the second ECC ECC2 read from the memories 241 to 250, and correct the detected error when the error is present. The second error correction circuit 237 may use the second error correction method. The data DATA" and data DATA_ECC2 may be equal to each other when the data DATA" has no error, and different from each other when the data DATA" has an error.

The first ECC generation circuit 233 may generate the first ECC ECC1 based on the data DATA_ECC2. The first ECC generation circuit 233 only generates the first ECC ECC1 based on the data DATA_ECC2, and does not correct an error within the data DATA_ECC2. Therefore, the data DATA_ECC2 and the data DATA' may be equal to each other. The first ECC generation circuit 233 may use the first error correction method.

Between the memory controller 210 and the module controller 230, the first error correction method is used. However, the second error correction method is used from the rear stage of the module controller 230. That is, the module controller 230 terminates the first error correction method, and uses the second error correction method different from the first error correction method. This is in order to perform a stronger error correction operation in the memory module 220.

Each of the memories 241 to 250 may store 64-bit data during one write operation, and output 64-bit data during one read operation. FIG. 2 illustrates a distribution pattern of the data DATA" and the second ECC ECC2 in the memories 241 to 250. The 512-bit data DATA" may be written to/read from the eight memories 241 to 248 among the 10 memories 241 to 250, and the 128-bit second ECC ECC2 may be written to/read from the two memories 249 and 250. The distribution pattern of the data DATA" and the second ECC ECC2 does not need to be configured in the same manner as described with reference to FIG. 2. The distribution pattern is not particularly limited as long as the data DATA" and the second ECC ECC2 are distributed and stored in the memories 241 to 250. Furthermore, the number of the memories 241 to 250 is not limited to 10, but may be set to a random number equal to or more than one. The memories 241 to 250 may be one of all types of memories such as a DRAM, PCRAM and Flash memory.

During a write operation, the data DATA are transferred to the memories 241 to 250 through the first ECC generation circuit 211 and the second ECC generation circuit 235, or transferred to the memories 241 to 250 through the first ECC generation circuit 211, the first error correction circuit 231 and the second ECC generation circuit 235. In most cases in which the data DATA' has no error, the data DATA is transferred to the memories 241 to 250 through the first ECC generation circuit 211 and the second ECC generation circuit 235. Thus, latency required during the write operation in the memory system 200 may be reduced more than in the memory system 100.

Figure 3:
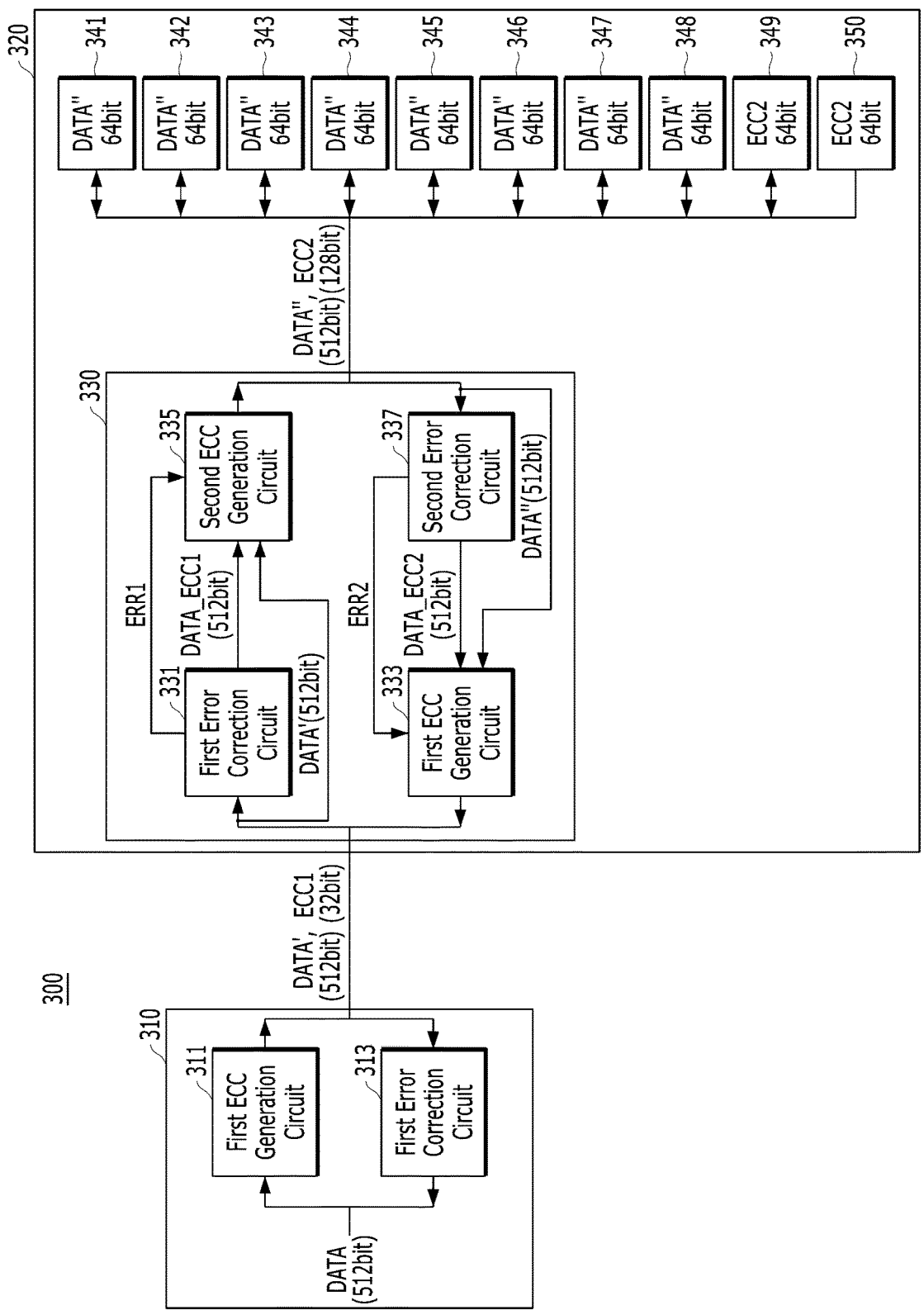
FIG. 3 is a configuration diagram illustrating a memory system 300 in accordance with an embodiment of the present disclosure.

FIG. 3 is a configuration diagram illustrating a memory system 300 in accordance with an embodiment of the present disclosure. FIG. 3 illustrates only parts which are directly related to data transmission and error correction in the memory system 300.

Referring to FIG. 3, the memory system 300 may include a memory controller 310 and a memory module 320. In the memory system 300 of FIG. 3, a second error correction circuit 337 and a first ECC generation circuit 333 within a module controller 330 may be different from those of the memory system 200 of FIG. 2.

The second error correction circuit 337 may detect an error within data DATA" using a second ECC ECC2 read from the memories 341 to 350, and correct the detected error when the error is present. The second error correction circuit 337 may use a second error correction method. The data DATA" and data DATA_ECC2 may be equal to each other when the data DATA" has no error, and different from each other when the data DATA" has an error. An error signal ERR2 outputted from the second error correction circuit 337 may be enabled when an error is detected.

The first ECC generation circuit 333 may perform a third operation of generating a first ECC ECC1 based on the data DATA" during a read operation. The third operation of the first ECC generation circuit 333 may be performed in parallel to the error correction operation of the second error correction circuit 337. When the second error correction circuit 337 detects an error, the error signal ERR2 may be enabled, and the first ECC generation circuit 333 may cancel the third operation in response to the enabled error signal ERR2. Then, the first ECC generation circuit 333 may perform a fourth operation of generating the first ECC ECC1 based on the data DATA_ECC2 whose error has been corrected by the second error correction circuit 337, not the data DATA". That is, the first ECC generation circuit 333 may basically generate the first ECC ECC1 based on the data DATA". However, only when an error is found in the data DATA", the first ECC generation circuit 333 may generate the first ECC ECC1 based on the data DATA_ECC2 whose error has been corrected.

Since the first ECC generation circuit 333 quickly generates the first ECC ECC1 when the data DATA" has no error, the latency required for the write operation of the memory system 300 may be reduced more than in the memory systems 100 and 200. Although the data DATA" has an error, latency required for the write operation of the memory system 300 may be only equal to those of the memory systems 100 and 200, and not be increased.

Figure 4:
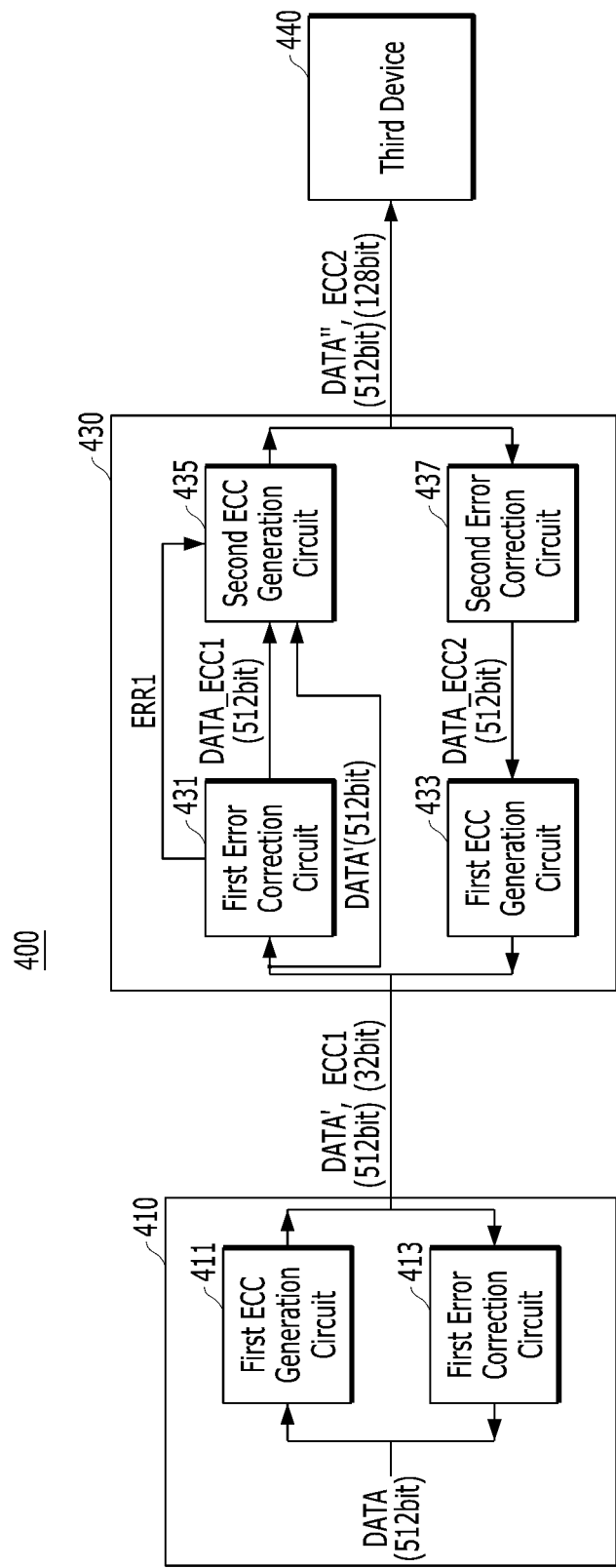
FIG. 4 is a configuration diagram illustrating an integrated circuit system 400 in accordance with an embodiment of the present disclosure.

FIG. 4 is a configuration diagram illustrating an integrated circuit system 400 in accordance with an embodiment of the present disclosure. FIG. 4 illustrates an example in which the present embodiment is not applied to a memory system, but applied to a different type of integrated circuit system 400.

The integrated circuit system 400 may include a first device 410, a second device 430 and a third device 440. Each of the first device 410, the second device 430 and the third device 440 may indicate a device for transmitting/receiving data, and include one or more integrated circuit chips. In the following descriptions, an upstream operation may indicate an operation in which data are transmitted in a direction of the first device 410→the second device 430→the third device 440, and a downstream operation may indicate an operation in which data are transmitted in a direction of the third device 440→the second device 430→the first device 410.

The first device 410 may include a first ECC generation circuit 411 and a first error correction circuit 413.

The first ECC generation circuit 411 may generate a first ECC ECC1 based on data DATA to be transferred toward the third device during the upstream operation. During the upstream operation, the first ECC generation circuit 211 only generates the first ECC ECC1 based on the data DATA, and does not correct an error. Therefore, the data DATA may be equal to data DATA'.

During the downstream operation, the first error correction circuit 413 may detect an error within the data DATA' transferred from the second device 430 using the first ECC ECC1 from the second device 430, and correct the detected error when the error is present. The data DATA' and the data DATA may be equal to each other when the data DATA' has no error, and different from each other when the data DATA' has an error. The data DATA may be transferred to the host. The first ECC generation circuit 411 and the first error correction circuit 413 may use a first error correction method.

The second device 430 may include a first error correction circuit 431, a first ECC generation circuit 433, a second ECC generation circuit 435 and a second error correction circuit 437.

During the upstream operation, the first error correction circuit 431 may detect an error within the data DATA' using the first ECC ECC1 transferred from the first device 410, and correct the detected error when the error is present. The first error correction circuit 431 may use the first error correction method. The data DATA' and data DATA_ECC1 may be equal to each other when the data DATA' has no error, and different from each other when the data DATA' has an error. An error signal ERR1 outputted from the first error correction circuit 431 may be enabled when an error within the data DATA' is detected.

The second ECC generation circuit 435 may perform a first operation of generating a second ECC ECC2 based on the data DATA' transferred from the first device 410 during the upstream operation. The first operation of the second ECC generation circuit 435 may be performed in parallel to the error correction operation of the first error correction circuit 431. Since the second ECC generation circuit 435 uses a second error correction method which is more complicated than the first error correction method, the time required for the first operation may be longer than the time required for the error correction operation of the first error correction circuit 431. When the first error correction circuit 431 detects an error, the error signal ERR1 may be enabled, and the second ECC generation circuit 435 may cancel the first operation in response to the enabled error signal ERR1. Then, the second ECC generation circuit 235 may perform a second operation of generating the second ECC ECC2 based on the data DATA_ECC1 whose error has been corrected by the first error correction circuit 431, not the data DATA'. That is, the second ECC generation circuit 435 may basically generate the second ECC ECC2 based on the data DATA'. However, only when an error is found in the data DATA', the second ECC generation circuit 435 may generate the second ECC ECC2 based on the data DATA_ECC1 whose error has been corrected. In most cases in which the data DATA' has no error, the first operation of the second ECC generation circuit 435 is performed in parallel to the error correction operation of the first error correction circuit 431. Therefore, the second ECC ECC2 may be quickly generated.

During the downstream operation, the second error correction circuit 437 may detect an error within data DATA" using the second ECC ECC2 transferred from the third device 440, and correct the detected error when the error is present. The second error correction circuit 437 may use the second error correction method. The data DATA" and data DATA_ECC2 may be equal to each other when the data DATA" has no error, and different from each other when the data DATA" has an error.

The first ECC generation circuit 433 may generate the first ECC ECC1 based on the data DATA_ECC2. The first ECC generation circuit 433 only generates the first ECC ECC1 based on the data DATA_ECC2, but does not correct an error within the data DATA_ECC2. Therefore, the data DATA_ECC2 and the data DATA' may be equal to each other. The first ECC generation circuit 433 may use the first error correction method. FIG. 4 illustrates that the first ECC generation circuit 433 generates the first ECC ECC1 based on the data DATA_ECC2. However, the first ECC generation circuit 433 may generate the first ECC ECC1 based on the data DATA" or generate the first ECC ECC1 based on the data DATA_ECC2, depending on whether the first ECC generation circuit 433 detects an error within the data DATA", like the first ECC generation circuit 333 of FIG. 3.

The third device 440 may receive the data DATA" and the second error ECC ECC2 from the second device 430 during the upstream operation, and transmit the data DATA" and the second ECC ECC2 to the second device 430 during the downstream operation.

Although various embodiments have been described for illustrative purposes, it will be apparent to those skilled in the art that various changes and modifications may be made without departing from the spirit and scope of the invention as defined in the following claims.

What is claimed is:

1. An integrated circuit system comprising a first device, a second device and a third device,
   wherein the first device is suitable for transmitting upstream data and a first Error Correction Code (ECC) corresponding to the upstream data during an upstream operation,
   wherein the second device comprises:
   a first error correction circuit suitable for correcting an error within the transmitted upstream data when the error is detected within the transmitted upstream data, through the transmitted first ECC; and
   a second ECC generation circuit suitable for generating a second ECC based on the transmitted upstream data when an error is not detected within the transmitted upstream data or the error-corrected upstream data when the error is corrected within the transmitted upstream data,
   wherein the third device receives the generated second ECC and the transmitted upstream data or the error-corrected upstream data.

2. The integrated circuit system of claim 1, wherein the second ECC generation circuit generates the second ECC by:
   first performing a first operation of generating the second ECC based on the transmitted upstream data,
   cancelling the first operation when the error is corrected within the transmitted upstream data while the first operation is performed, and
   performing a second operation of generating the second ECC based on the error-corrected upstream data.

3. The integrated circuit system of claim 1, wherein the second ECC has a greater error correction ability than the first ECC.

4. The integrated circuit system of claim 1,
   wherein the third device transmits downstream data and a second ECC corresponding to the downstream data during a downstream operation,
   wherein the second device further comprises:
   a second error correction circuit suitable for correcting an error within the transmitted downstream data when the error is detected within the transmitted downstream data, through the transmitted second ECC; and
   a first ECC generation circuit suitable for generating a first ECC based on the transmitted downstream data or the error-corrected downstream data outputted from the second error correction circuit,
   wherein the generated first ECC and the transmitted downstream data or the error-corrected downstream data are transmitted to the first device.

5. The integrated circuit system of claim 1,
   wherein the third device transmits downstream data and a second ECC corresponding to the downstream data during a downstream operation,
   wherein the second device further comprises:
   a second error correction circuit suitable for correcting an error within the transmitted downstream data when the error is detected within the transmitted downstream data, through the transmitted second ECC; and a first ECC generation circuit suitable for generating a first ECC based on the transmitted downstream data when an error is not detected within the transmitted downstream data or the error-corrected downstream data when the error is corrected within the transmitted downstream data, wherein the generated first ECC and transmitted downstream data or the error-corrected downstream data are transmitted to the first device.

6. The integrated circuit system of claim 1, wherein each of the first to third devices comprises one or more integrated circuit chips.

7. An operating method of a controller, the operating method comprising:
- error-decoding write data through a first error correction code, the write data being provided with the first error correction code;
- error-encoding, when the provided write data is not error-corrected during the error-decoding of the provided write data, the provided write data to generate a second error correction code;
- error-encoding, when the provided write data is error-corrected during the error-decoding of the provided write data, the error-corrected write data to generate a third error correction code; and
- controlling a memory device to store therein a pair of the provided write data and the second error correction code or a pair of the error-corrected write data and the third error correction code.

8. The operating method of claim 7, further comprising:
- error-decoding read data through a read error correction code, the read data being provided with the read error correction code from the memory device;
- error-encoding, when the provided read data is not error-corrected during the error-decoding of the provided read data, the provided read data to restore the first error correction code;
- error-encoding, when the provided read data is error-corrected during the error-decoding of the provided read data, the error-corrected read data to restore the first error correction code; and
- providing an external with the restored first error correction code and one between the provided read data and the error-decoded read data paired with the restored first error correction code, wherein the read error correction code is one of the second and third error correction codes.

* * * * *